(12) United States Patent
Huang et al.

(10) Patent No.: US 6,377,473 B1
(45) Date of Patent: Apr. 23, 2002

(54) EMI SHIELD DEVICE FOR MOBILE PHONE

(75) Inventors: Nan-Tsung Huang; Kun-Tsan Wu, both of Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/643,305

(22) Filed: Aug. 21, 2000

(30) Foreign Application Priority Data

Aug. 20, 1999 (TW) ...................................... 88214193 U

(51) Int. Cl.[7] .................................................. H05K 9/00
(52) U.S. Cl. ........................ 361/816; 361/801; 361/800; 361/804; 439/608; 439/939
(58) Field of Search .................................. 361/816, 752, 361/753, 756, 796, 800, 801, 814; 439/607, 608, 609, 610, 92, 96, 95, 939

(56) References Cited

U.S. PATENT DOCUMENTS

| | | | | |
|---|---|---|---|---|
| 5,495,399 A | * | 2/1996 | Gore et al. ................. | 361/814 |
| 5,748,455 A | * | 5/1998 | Phillips et al. .............. | 361/753 |
| 6,206,728 B1 | * | 3/2001 | Krehbiel et al. ............ | 439/814 |

* cited by examiner

Primary Examiner—Jeffrey Gaffin
Assistant Examiner—Hung Bui
(74) Attorney, Agent, or Firm—Wei Te Chung

(57) ABSTRACT

An EMI shield device is used for shielding electronic components on a printed circuit board (PCB) (13) of a mobile phone (1). The shield device comprises an upper cover (11), a lower cover (14), an EMI shield (12) and a fastening portion (2) releasably securing the shield onto the upper cover. The shield has a top wall (121) and side flanges (122) downwardly depending from edges of the top wall for shielding the electronic components on the PCB. The fastening portion includes a plurality of internal latches (21) downwardly depending from a lower surface (113) of the upper cover, and a plurality of holes (22) defined in the shield to engage with the latches. The upper and lower covers are attached together to enclose the shield and the PCB in a space therebetween. An alternative fastening portion comprises use of screws and an upper cover with internally threaded posts downwardly depending from the lower surface of the upper cover.

2 Claims, 6 Drawing Sheets

EMI SHIELD DEVICE FOR MOBILE PHONE

FIELD OF THE INVENTION

The present invention relates to a shield device for shielding electronic components on a printed circuit board, and particularly to an EMI Shield easily assembled to and disassembled from a printed circuit board of a mobile phone.

BACKGROUND OF THE INVENTION

Mobile phones are subject to external EMI which can result in signal distortion. Thus, EMI sensitive electronic components on a printed circuit board of a mobile phone are conventionally protected from EMI by a shield. Referring to FIG. 3 (prior art), a conventional EMI shield in a mobile phone (not labeled) comprises a shield 51 soldered onto a printed circuit board (PCB) 52 to shield electronic components (not labeled) on the PCB 52. An upper cover 50 and a lower cover 53 are assembled together to enclose the PCB 52 and the shield 51 therein. The shield 51 is required to be fixed on the PCB 52 via a soldering process, which is not convenient. Furthermore, in order to replace or repair the electronic components, the shield must be desoldered from the PCB. This makes any repairs inconvenient and cumbersome.

U.S. Pat. No. 5,748,455 discloses one solution to the problem mentioned above. Referring to FIG. 4 (prior art), a lower cover 67 forms a plurality of posts 69 therein, each post defining a threaded hole (not labeled) therethrough for engaging with a corresponding screw 70. A PCB 61 defines a plurality of threaded holes 62 corresponding to the posts 69. A shield 63 defines a plurality of cutouts 66 at edges thereof for fitting to the periphery of the posts 69. A plurality of spring pieces 64 sidewisely extends from edges of the shield 63, and a plurality of retaining pieces 65 perpendicularly projects from edges of the shield 63 adjacent the spring pieces 64. In assembly, the spring pieces 64 abut the PCB 61, and the retaining pieces 65 abut an inner wall 68 of the lower cover 67 and the PCB 61. The screws 70 are extended through the posts 69 and threaded holes 62 of the PCB 61 and are secured in an upper cover 60. Therefore, the upper and lower covers 60, 67, the shield 63 and the PCB 61 are fixedly assembled together.

The prior art, comprising posts, threaded holes, screws, spring pieces, and retaining pieces, is unduly complicated and cumbersome. The prior art shield is designed to shield the entire PCB, whereas only certain components on the PCB need be shielded to obtain the desired protection from external EMI.

Therefore, a mobile phone with simplified shielding design is desired.

BRIEF SUMMARY OF THE INVENTION

A main object of the present invention is to provide an EMI shield device for use in a mobile phone, wherein a shield is easily detached from the phone's printed circuit board (PCB). This simplifies repair or replacement of electronic components on the PCB.

A shield device in accordance with the present invention comprises an upper and a lower covers, a shield and a fastening portion. The upper cover forms a plurality of latches along opposite sides of a lower surface thereof. The shield has a top wall and side flanges depending downwardly from edges of the top wall. A plurality of holes is defined in opposite side flanges of the shield for engaging with the latches, thereby securing the shield onto the upper cover. The upper and the lower covers are assembled together to enclose the PCB and the shield therein, the shield shielding the electronic components on the PCB.

An alternative fastening portion comprises screws and an upper cover with internal threaded posts downwardly depending from the lower face of the upper cover.

Other objects, advantages and novel features of the invention will become more apparent from the following detailed description when taken in conjunction with the accompanying drawings.

DETAILED DESCRIPTION OF THE INVENTION

Figure 1A:
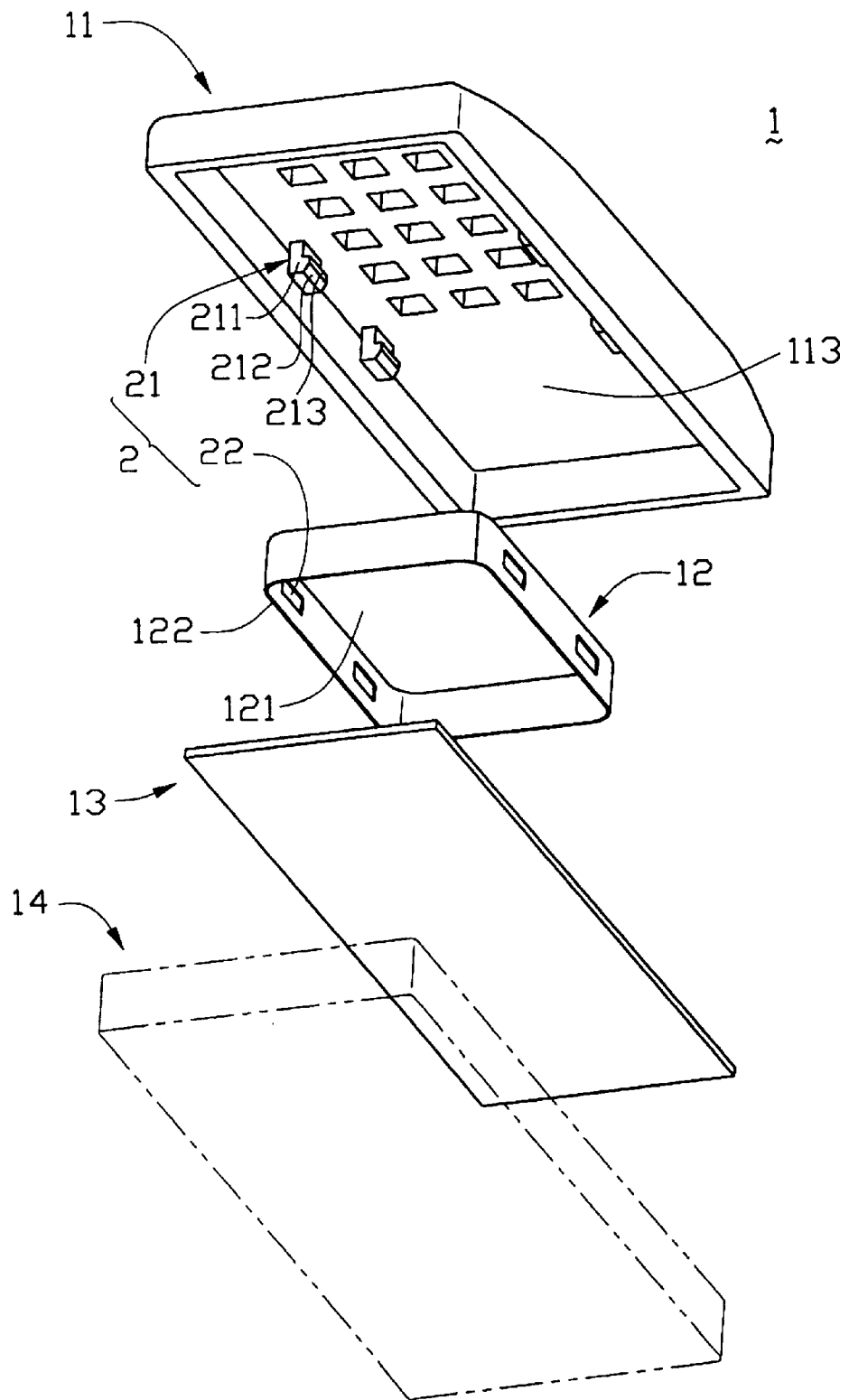
FIG. 1A is an exploded view of a mobile phone in accordance with the present invention.
Figure 1B:
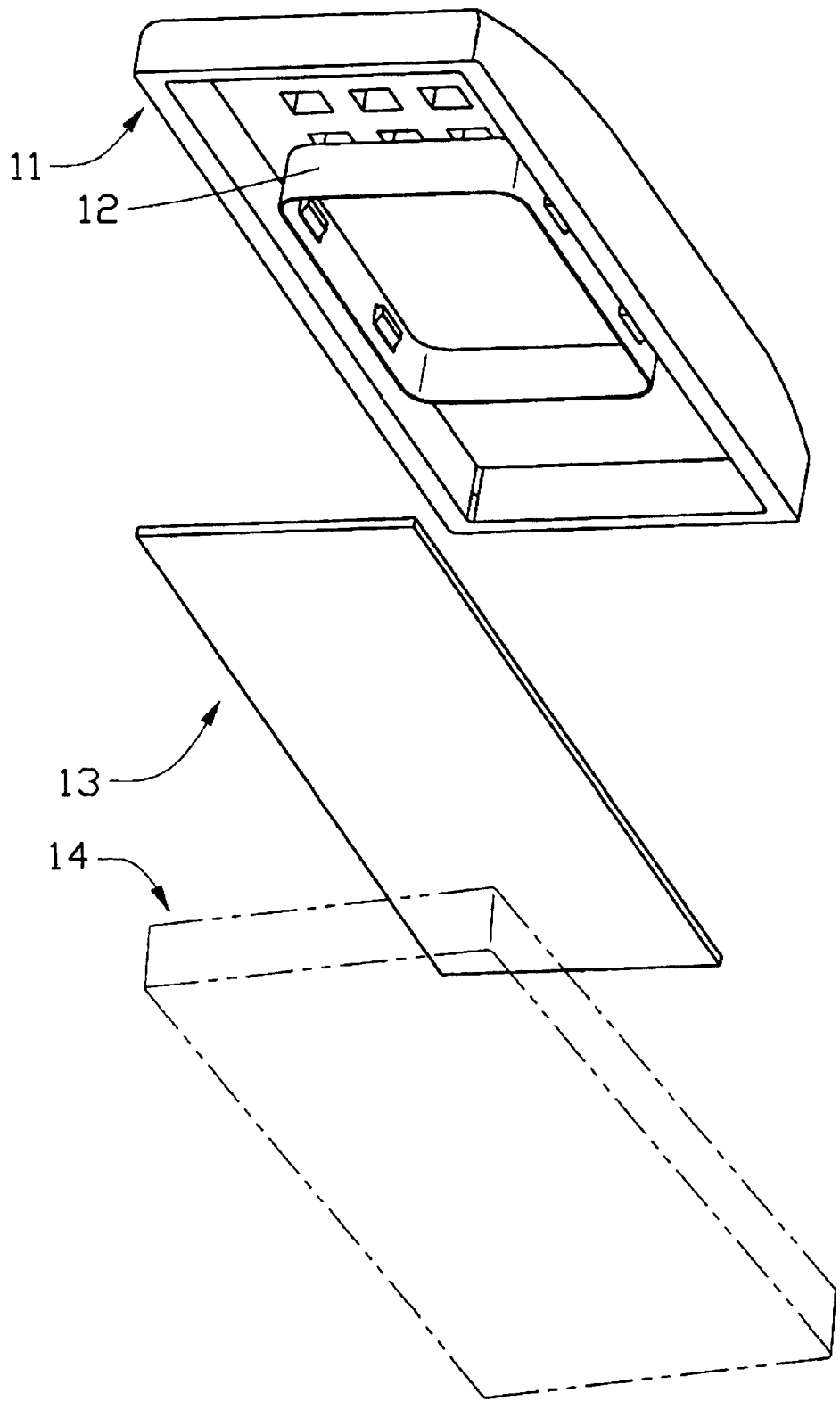
FIG. 1B is a pre-assembled view of FIG. 1A, wherein an EMI shield is assembled on an upper cover.

Referring to FIGS. 1A and 1B, a preferred embodiment of the shield device in accordance with the present invention for protecting electronic components on a printed circuit board (PCB) 13 in a mobile phone 1 comprises an upper cover 11, a lower cover 14, an EMI shield 12 and a fastening portion 2.

The shield 12 is substantially rectangular, and comprises a top wall 121 and side flanges 122 extending perpendicularly and downwardly from edges of the top wall 121. The wall 121 and flanges 122 form a space to accommodate the electronic components (not shown) of the PCB 13 therein.

The fastening portion 2 includes a plurality of latches 21 and a plurality of holes 22 corresponding to the latches 21. The latches 21 extend downwardly from a lower surface 113 of the upper cover 11 and are arrayed in two parallel rows along opposite elongate edges of the upper cover 11, and define a border around the electronic components (not shown) of the PCB 13 to be protected. Each latch 21 forms a hook 211 at a lower end thereof pointing toward a corresponding latch 21 in an opposite row of latches 21. The hook 211 has an inclined face 212 and a vertical face 213 forming an obtuse angle therebetween for facilitating the engagement of the latches 21 with the holes 22. The holes 22 are defined in opposite side flanges 122 of the shield 12 to engage with the latches 21.

In assembly, the latches 21 engage with the holes 22, and the hooks 211 are inserted into the holes 22 for securing the shield 12 onto the lower surface 113 of the upper cover 11. The upper cover 11 and the lower cover 14 are attached together by conventional means which are not described herein, and together enclose the shield 12 and the PCB 13 therein. Thus, the shield 12 together with the upper and lower covers 11, 14 shields the electronic components (not shown) of the PCB 13.

The shield 12 can be easily removed from the PCB 13 by disengaging the upper cover 11 from the lower cover 14. This simplifies repair or replacement of the electronic components (not shown) on the PCB 13. Moreover, the shield 12 can be easily removed from the upper cover 11 by unfastening the fastening portion 2.

Figure 2A:
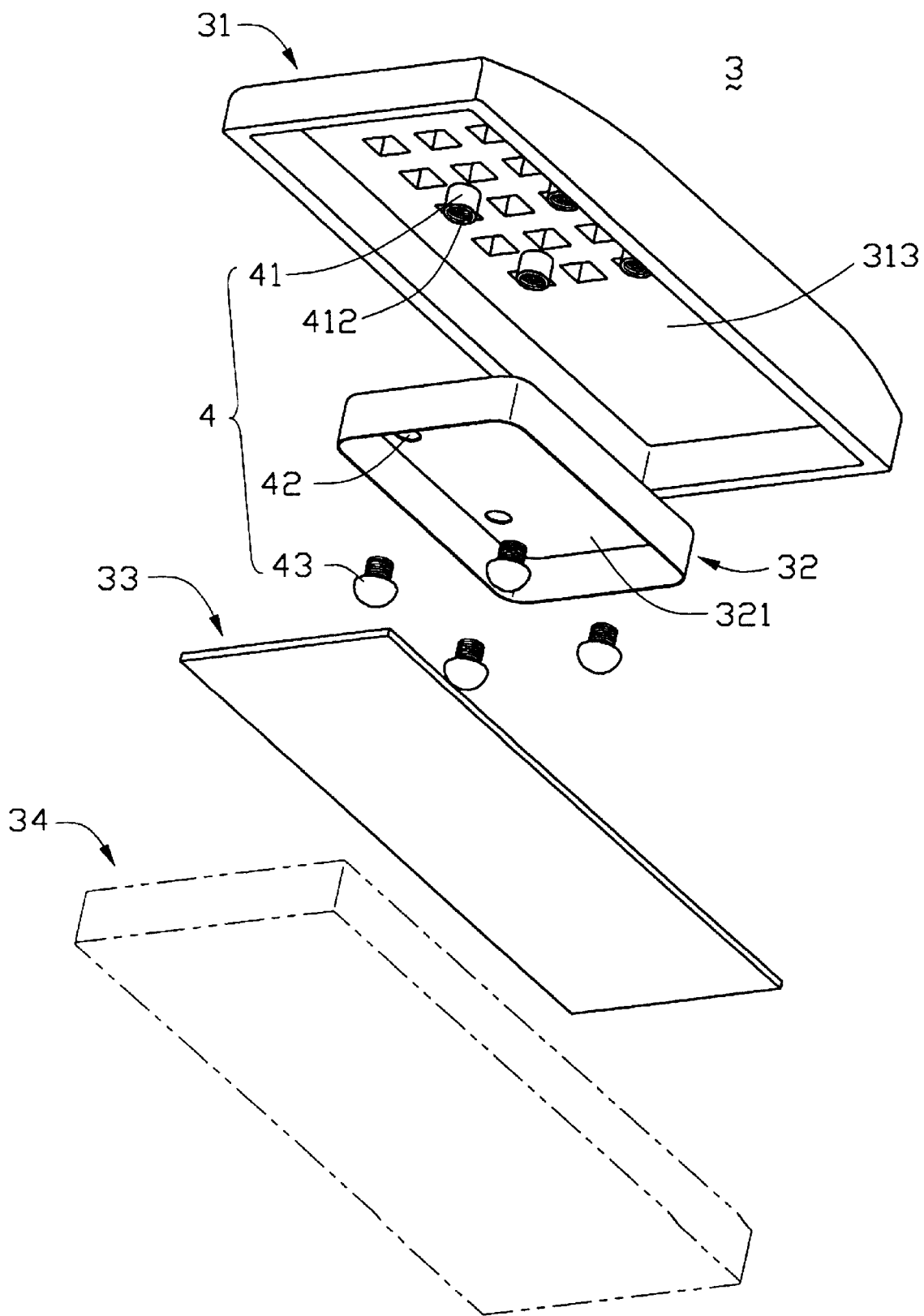
FIG. 2A is an exploded view of a mobile phone of an alternative embodiment of the present invention.
Figure 2B:
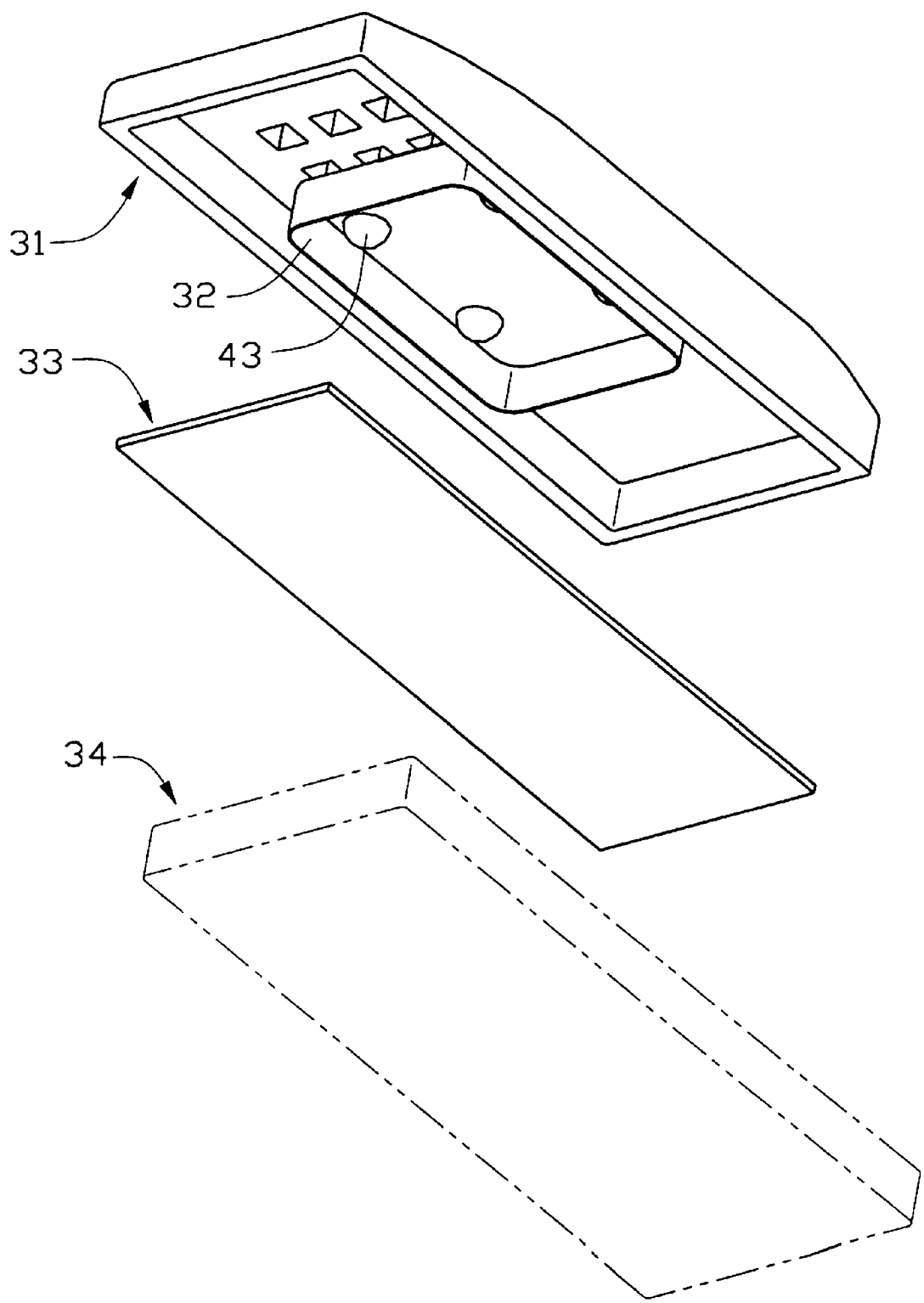
FIG. 2B is a pre-assembled view of FIG. 2A, wherein an EMI shield is assembled on an upper cover.
Figure 3:
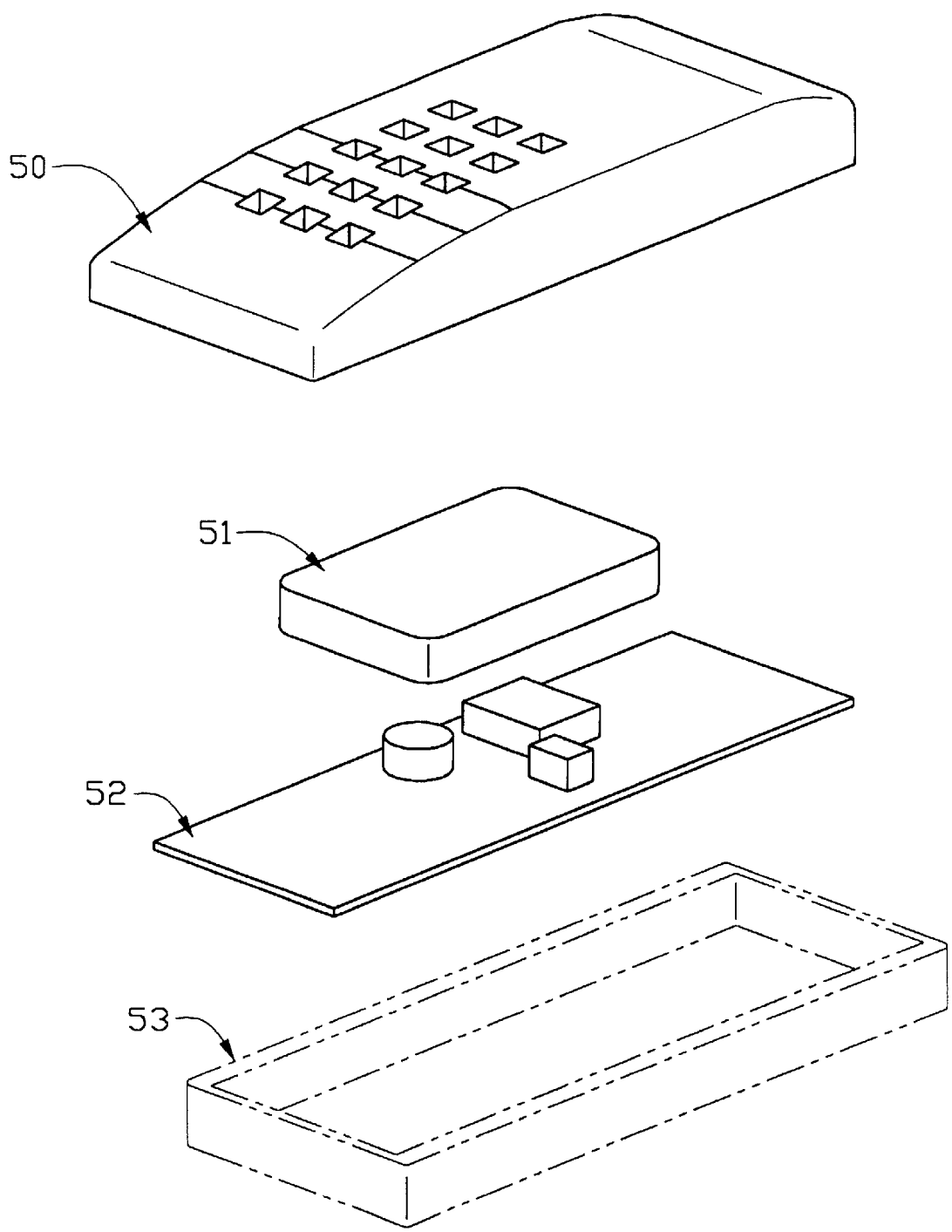
FIG. 3 is an exploded view of a conventional mobile phone.
Figure 4:
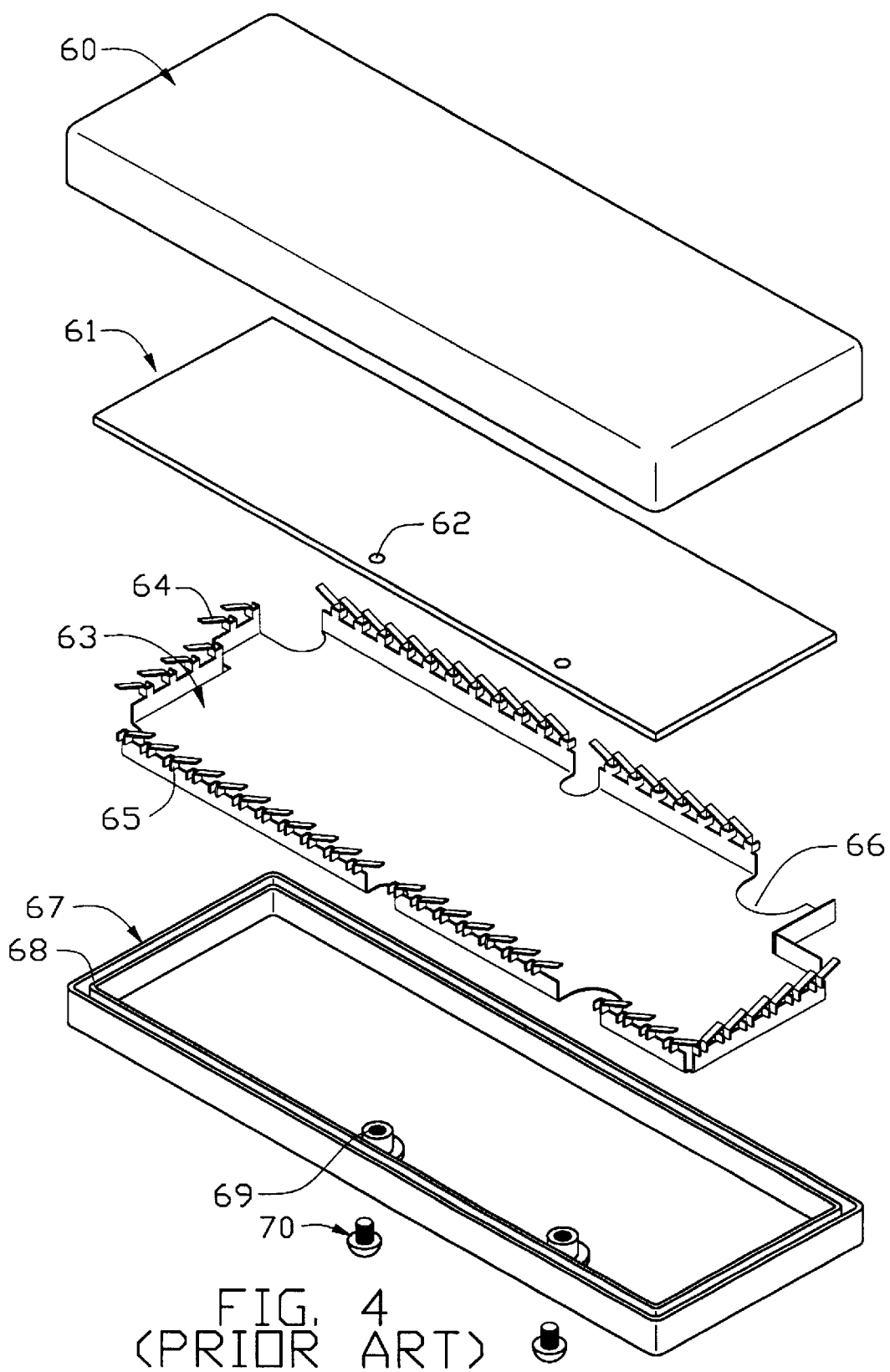
FIG. 4 is an exploded view of another conventional mobile phone.

An alternative embodiment of the present invention is shown in FIGS. 2A and 2B. A mobile phone 3 in accordance with the alternative embodiment is similar to the mobile phone 1, except for a fastening portion 4.

The fastening portion 4 comprises a plurality of hollow posts 41, through holes 42 and screws 43. The hollow posts 41 extend downwardly from a lower surface 313 of an upper cover 31, and are arrayed in two parallel rows spaced from each other at a distance sufficient to form a space to accommodate the electronic components (not shown) of a PCB 33 within an EMI shield 32. Each hollow post 41 has a threaded hole 412 for engaging with the screws 43. The through holes 42 are defined through a top wall 321 of the EMI shield 32, corresponding to the hollow posts 41.

In assembly, the screws 43 are extended through the through holes 42 and are retained in the corresponding hollow posts 41, whereby the shield 32 is fixedly assembled onto the upper cover 31. The upper cover 31 and a lower cover 34 are attached together by conventional means which are not described herein, and together enclose the shield 32 and the PCB 33 therein.

The shield 32 can be easily removed from the PCB 33 by disengaging the upper cover 31 from the lower cover 34. Moreover, the shield 32 can be easily removed from the upper cover 31 by unfastening the fastening portion 4. This simplifies repair or replacement of the electronic components (not shown) on the PCB 33.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mobile phone comprising:

a lower cover and an upper cover together defining a space therebetween;

a printed circuit board and a shield both disposed in said space, said shield seated upon the printed circuit board and including a wall and a circumferential flange to enclose electronic components mounted on the printed circuit board, said printed circuit board facing one of said lower cover and said upper cover, and said shield facing the other of said lower cover and said upper cover; and means for directly securing the shield to the other of said lower cover and said upper cover together including a pair of latches depending from a lower surface of the other of said lower cover and said upper cover, and a pair of holes in the circumferential flange of the shield and engaged with the latches.

2. The mobile phone as claimed in claim 1, wherein each latch forms a hook at an end thereof, the hook having an inclined face and a vertical face forming an obtuse angle therebetween for facilitating engagement of the latch with the hole.

\* \* \* \* \*